United States Patent
Hung et al.

(10) Patent No.: US 12,334,314 B2
(45) Date of Patent: Jun. 17, 2025

(54) DRY ETCHER UNIFORMITY CONTROL BY TUNING EDGE ZONE PLASMA SHEATH

(71) Applicant: Taiwan Semiconductor Manufacturing Co., Ltd., Hsinchu (TW)

(72) Inventors: Po-Lung Hung, Hsinchu (TW); Yi-Tsang Hsieh, Hsinchu (TW); Yu-Hsi Tang, Hsinchu (TW); Chih-Ching Cheng, Hsinchu (TW); Chih-Teng Liao, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 358 days.

(21) Appl. No.: 17/461,641

(22) Filed: Aug. 30, 2021

(65) Prior Publication Data

US 2023/0067400 A1 Mar. 2, 2023

(51) Int. Cl.
*H01L 21/3065* (2006.01)
*H01J 37/32* (2006.01)

(52) U.S. Cl.
CPC .. *H01J 37/32697* (2013.01); *H01J 37/32568* (2013.01); *H01J 37/32642* (2013.01); *H01L 21/3065* (2013.01); *H01J 37/32082* (2013.01); *H01J 2237/3343* (2013.01)

(58) Field of Classification Search
CPC .......... H01J 37/32568; H01J 37/32642; H01J 37/32082; H01L 21/3065
See application file for complete search history.

(56) References Cited

U.S. PATENT DOCUMENTS

| | | | |
|---|---|---|---|
| 2007/0224709 A1* | 9/2007 | Ogasawara | H01J 37/32642 700/121 |
| 2018/0182635 A1* | 6/2018 | Tsukahara | C23C 16/4585 |
| 2019/0103254 A1* | 4/2019 | Lane | H01J 37/32385 |
| 2020/0185193 A1* | 6/2020 | Koshimizu | H01J 37/32577 |
| 2021/0126559 A1* | 4/2021 | Matsuyama | H02N 13/00 |
| 2021/0249233 A1* | 8/2021 | Kajifusa | H01L 21/31116 |
| 2021/0407772 A1* | 12/2021 | Koshimizu | H01J 37/32715 |
| 2022/0037127 A1* | 2/2022 | Nakatani | H01L 21/67069 |
| 2022/0037129 A1* | 2/2022 | Koshimizu | H01J 37/32706 |
| 2023/0092887 A1* | 3/2023 | Hopkins | H01J 37/32146 315/111.21 |

OTHER PUBLICATIONS

Wikipedia "Electric Field" via https://en.wikipedia.org/wiki/Electric_field#:~:text=An%20electric%20field%20(sometimes%20E,their%20charges%20are%20the%20same ; pp. 1-14 (Year: 2023).*

* cited by examiner

*Primary Examiner* — Binh X Tran
(74) *Attorney, Agent, or Firm* — Seed IP Law Group

(57) ABSTRACT

A plasma etching system generates a plasma above a wafer in a plasma etching chamber. The wafer is surrounded by a focus ring. The plasma etching system straightens a plasma sheath above the focus ring by generating a supplemental electric field above the focus ring.

20 Claims, 16 Drawing Sheets

DRY ETCHER UNIFORMITY CONTROL BY TUNING EDGE ZONE PLASMA SHEATH

BACKGROUND

Technical Field

The present disclosure relates to the field of semiconductor processing. The present disclosure relates more particularly to plasma etching.

Description of the Related Art

There has been a continuous demand for increasing computing power in electronic devices including smart phones, tablets, desktop computers, laptop computers and many other kinds of electronic devices. One way to increase computing power in integrated circuits is to increase the number of transistors and other integrated circuit features that can be included for a given area of semiconductor substrate.

To continue decreasing the size of features in integrated circuits, various thin-film deposition techniques, etching techniques, and other processing techniques are implemented. These techniques can form very small features. However, there are many difficulties involved in ensuring high performance of the devices and features.

Plasma etching, or dry etching, is one technique for defining small features in integrated circuit. However, there are difficulties associated with maintaining uniformity across a wafer when using plasma etching processes. In some cases it is possible that integrated circuit features will not be formed properly at some locations in the wafer when using plasma etching processes. This can lead to poorly functioning integrated circuits or even scrapped wafers.

BRIEF DESCRIPTION OF THE SEVERAL VIEWS OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
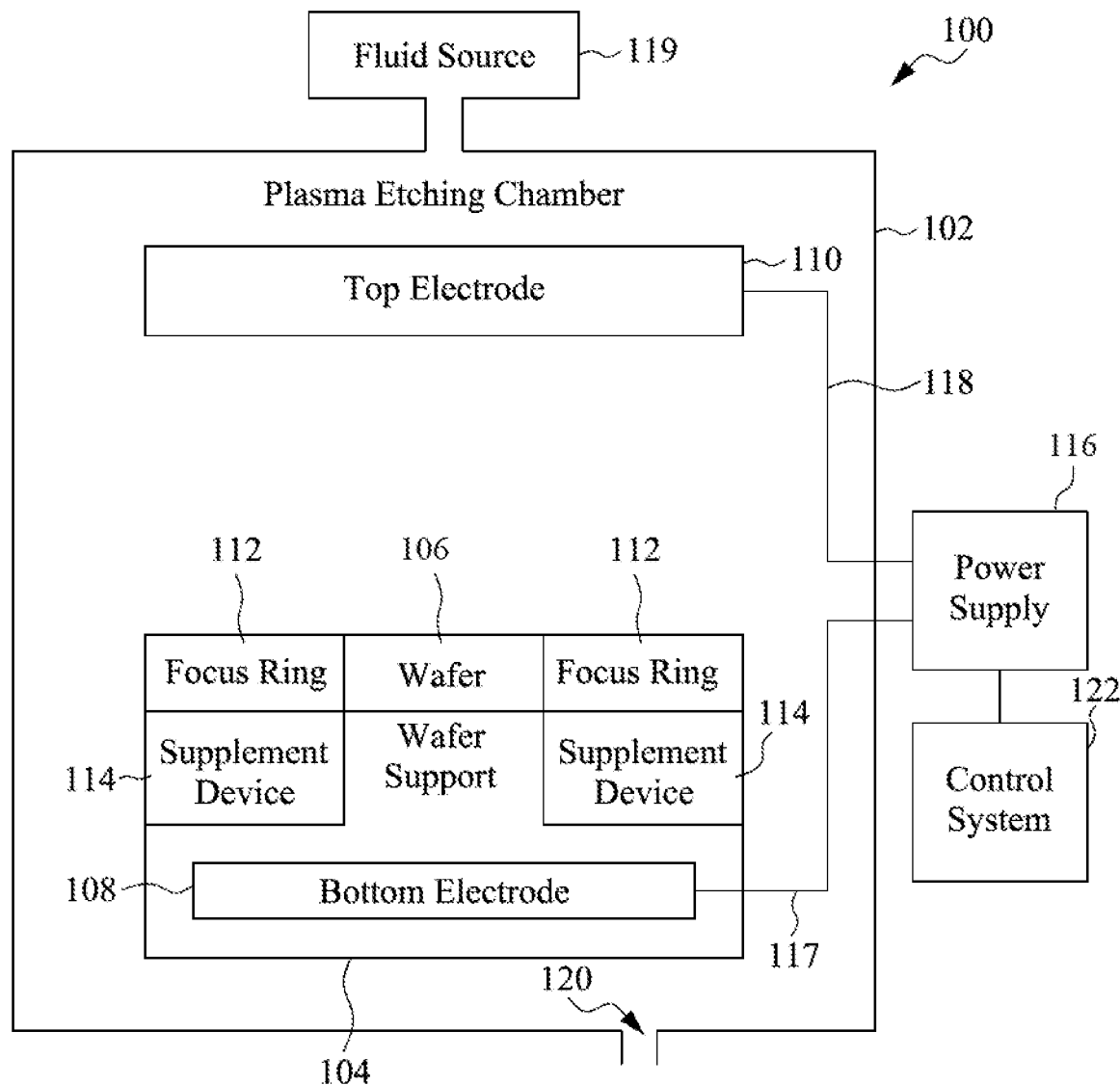
FIG. 1 is a block diagram of a plasma etching system, according to some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide a plasma etching process and system that maintains uniformity in defining features across a wafer. A wafer is supported on a wafer support within a plasma etching chamber. A focus ring surrounds the wafer. A plasma is generated by applying a voltage between a bottom electrode embedded in the wafer support and a top electrode positioned above the wafer. The plasma includes a plasma sheath. Embodiments of the present disclosure compensate for variations in the plasma sheath above the edge of the wafer and the focus ring by providing a supplemental electric field at the edge of the wafer and at the focus ring. The supplemental electric field reduces or eliminates the variations in the plasma sheath above the edges of the wafer. The result is that the plasma sheath is uniform above the entirety of the wafer and focus ring. This helps ensure that the plasma etching process will create uniform features across all regions of the wafer. This provides many benefits, including better functioning integrated circuits and increased wafer yields.

FIG. 1 is a block diagram of a plasma etching system 100, according to one embodiment. The plasma etching system 100 includes a plasma etching chamber 102, a wafer support 104 in the plasma etching system 100, and a wafer 106 supported by the wafer support 104. The plasma etching system 100 includes a bottom electrode 108 in the wafer support 104, a top electrode positioned above the wafer 106, a focus ring surrounding the wafer 112, and a supplement device 114. As will be set forth in more detail below, the components of the plasma etching system 100 cooperate to uniformly etch features at all regions of the wafer 106.

The plasma etching system 100 includes a power supply 116, a fluid source 119, and a fluid outlet 120. The power supply 116 is coupled to the bottom electrode 108 by an electrical connector 117 and to the top electrode 110 by an electrical connector 118. The fluid source 119 is configured to provide a fluid into the plasma etching chamber 102. The fluid outlet 120 is configured to evacuate exhaust fluids from the plasma etching chamber 102.

During a plasma etching process, the fluid source 119 supplies an etching fluid into the plasma etching chamber 102. The power supply 116 applies a voltage between the bottom electrode 108 and top electrode 110. The voltage applied between the bottom electrode 108 and the top electrode 110 generates a plasma from the fluid within the plasma etching chamber 102. Ions from the plasma are driven downward onto the wafer 106. The ions etch the exposed portions of the wafer 106. The plasma etching process may etch trenches or vias in one or more exposed layers of the wafer 106. A mask may be formed on the wafer 106. The mask covers some portions of the wafer and exposes other portions of the wafer. The chemistry of the fluid is selected to result in ions that etch the material of one or more layers of the wafer exposed by the mask and to not significantly etch the material of the mask.

The focus ring 112 is configured to assist in the plasma etching process. The focus ring 112 is supported by the wafer support 104. The focus ring 112 laterally surrounds the wafer 106. The focus ring 112 has a material and shape selected to help focus ions onto the wafer 106 with a downward trajectory at the edges of the wafer. This helps promote uniformity of features formed at the edges of the wafer. The focus ring 112 may include silicon, quartz, silicon carbide, or other suitable materials.

In some cases, the thickness of the focus ring 112 is gradually reduced as the focus ring 112 participates in a large number of plasma etching processes. While the material of the focus ring 112 is selected to resist etching, the focus ring 112 may nevertheless be very slowly etched. In a single plasma etching process, the amount of material etched from the focus ring 112 may be unnoticeable, but after a large number of etching processes, the thickness of the focus ring 112 may be significantly reduced. In the example of a silicon focus ring, the thickness of the focus ring 112 may be reduced at a rate of about 0.2 mm per 400 hours. The relatively small reduction in thickness of the focus ring after hundreds of hours of plasma etching processes can result in detrimental effects in etching processes at the peripheral regions of the wafer 106.

When generating a plasma in the plasma etching chamber 102, a plasma is formed above the wafer 106. The plasma will include a plasma bulk or plasma body between the top electrode 110 and the wafer 106. The plasma will also include a plasma sheath between the wafer and the plasma bulk. The plasma sheath may also be termed an electrostatic sheath. The plasma sheath acts as a boundary of the plasma.

The plasma sheath assists in the plasma etching process. In particular, ions are ejected from the sheath downward toward the wafer. The ions etch the wafer in the direction that ions travel. Accordingly, if a plasma etching process is intended to etch a trench anisotropically in the downward direction, the trajectory of the ions should be in the downward direction.

The trajectory of the ions ejected from the plasma sheath is based on the shape of the plasma sheath. In particular, the ions are ejected from the plasma sheath in a direction perpendicular to the surface of the plasma sheath. If the surface of the plasma sheath is a plane parallel to the surface of the wafer and is positioned above the surface of the wafer, then the plasma sheath will drive charged particles straight downward onto the wafer 106 and will etch the wafer 106 anisotropically in the downward direction.

The shape of the plasma sheath is based, in part, on the voltage applied between the bottom electrode 108 and the top electrode 110 because the voltage between the bottom electrode 108 and the top electrode 110 results in the electric field that generates the plasma. The electric field is also affected by the materials between the bottom electrode 108 and the top electrode 110. This is because these materials have a dielectric constant that affects the electric field. The wafer 106 is one such material. The material of the wafer 106 and the height of the wafer 106 play a part in determining the location of the plasma sheath. Because the wafer 106 has a substantially uniform thickness and planar surface, the plasma sheath will be substantially planar above the wafer.

However, at the edge of the wafer, there is a vertical drop off. If this is not compensated for, the shape of the plasma sheath will be bent at the edge of the wafer due to the uneven surface at this location. This bend in the plasma sheath at the edges of the wafer will result in ions traveling in a direction other than vertical toward the wafer. Accordingly, at the edge of the wafer, the etching may occur in a diagonal direction. Trenches or apertures formed in locations near the edge of the wafer may not be straight and may not properly contact structures deeper within the wafer. This can result in non-functioning integrated circuits diced from the wafer.

The plasma etching system 100 utilizes a focus ring 112 to compensate for the edge of the wafer. The focus ring 112 is selected to have a material similar to the material of the wafer and a thickness that results in a top surface of the focus ring 112 being substantially even with the top surface of the wafer. Because the material and top surface of the focus ring 112 match with the material of the wafer and the top surface of the wafer 106, the plasma sheath will have a planar surface above the edge of the wafer 106. This results in ions traveling straight downward, even at locations near the edge of the wafer 106.

Initially, the height of the focus ring 112 will result in a planar plasma sheath at the edge of the wafer 106. However, as set forth above, after a large number of plasma etching processes, the height of the focus ring 112 gradually decreases. Eventually the height of the focus ring 112 is reduced to the extent that the plasma sheath begins to be bent at the edges of the wafer 106. Accordingly, decreases in the thickness of the focus ring 112 result in nonuniformities in the plasma sheath. In particular, the plasma sheath will curve downward at the periphery or edges of the wafer 106. The downward curve of the plasma sheath above the periphery or edges of the wafer 106 results in ions traveling with a diagonal trajectory toward the wafer 106 rather than a downward trajectory. The diagonal trajectory of the ions causes the features at the edge of the wafer 106 to be nonuniform compared to those at the central regions of the wafer 106. At smaller technology nodes, the trenches and vias formed at the edges of the wafer 106 may be misaligned and may not properly contact features below. For example, if the plasma etching process is configured to etch a via that contacts a metal line, but at the edge of the wafer 106 the etching ions travel in a diagonal trajectory, the via may not contact the metal line. This mismatch in alignment can result in a nonfunctioning integrated circuit at the edge of the wafer.

The plasma etching system of FIG. 1 overcomes this issue by providing a supplement device 114. The supplement device 114 generates a supplemental electric field above the focus ring 112. The strength of the supplemental electric field is selected to straighten the plasma sheath above the focus ring 112 and the edge of the wafer 106. With the plasma sheath straight or uniform above the focus ring 112, the etching ions will travel with a downward trajectory at the periphery of the wafer 106. The result is that features etched in the periphery of the wafer will be uniform with features etched in the central regions of the wafer 106. Advantageously, the features will be properly aligned with other features deeper within the wafer 106. Integrated circuits at the periphery of the wafer 106 will function properly and wafer yields will improve.

In one example, the power supply 116 is a radiofrequency power supply. The power supply 116 supplies a radiofrequency voltage between the bottom electrode 108 and the top electrode 110. In some cases, either the top electrode 110 or the bottom electrode 108 is grounded while the other electrode receives the radiofrequency voltage. The radiofrequency voltage may have a frequency between 500 kHz and 20 MHz, though other frequencies can be utilized without departing from the scope of the present disclosure.

In one embodiment, the supplement device 114 is an electrode that generates a supplemental electric field in addition to the electric field generated by the voltage applied between the bottom electrode 108 and the top electrode 110. The supplemental electrode may be positioned in the wafer support 104. The supplemental electrode may be separate from the main portion of the bottom electrode 108 so that the supplemental electrode can receive a different voltage than the main portion of the bottom electrode 108. In an example in which the bottom electrode 108 receives a radiofrequency voltage, the supplemental electrode may also receive a radiofrequency voltage in phase with but of a different amplitude than the radiofrequency voltage received by the bottom electrode 108. In one embodiment, the supplemental electrode may receive a radiofrequency voltage including a DC component relative to the bottom electrode 108. The DC component can be negative or positive depending on the desired supplemental electric field to be generated.

As described previously, applying a radiofrequency voltage between the top electrode 110 and the bottom electrode 108 results in an electric field between the top electrode 110 and the bottom electrode 108. The strength of the electric field between the top electrode 110 and the bottom electrode 108 depends, in part, on the amplitude of the voltage applied between the top electrode 110 and the bottom electrode 108. This electric field affects the formation of the plasma sheath. The supplemental electrode can compensate for the decrease in height in the focus ring 112 by generating a stronger electric field between the supplemental electrode and the top electrode 110.

In one embodiment, the bottom electrode 108 receives a radiofrequency voltage between 10 MHz and 20 MHz. The supplemental electrode also receives a radiofrequency voltage between 10 MHz and 20 MHz. However, the voltage received by the supplemental electrode has a DC component between 20 V and 60 V. In one example, the DC component received by the supplemental electrode is 40 V and the frequency is 13.56 MHz. The DC component of the supplemental electrode can be selected to compensate for the decreased height of the focus ring. The extra DC component received by the supplemental electrode can cause the plasma sheath to be higher above the focus ring than above the wafer 106 so that the plasma sheath is substantially planar above both the wafer 106 and the focus ring 112. The supplemental electrode can be utilized to fine tune the shape of the plasma sheath high or low at the wafer edge by selecting a supplemental voltage.

In another example in which the supplement device is a supplemental electrode, the supplemental electrode is positioned adjacent to the top electrode 110. The supplemental electrode may receive a voltage with a DC offset relative to the top electrode. If the top electrode 110 is grounded, then the supplemental electrode may receive a DC voltage higher or lower than ground. If the top electrode 110 receives the RF voltage while the bottom electrode 108 is grounded, the supplemental electrode may receive an RF voltage with a different amplitude or with a DC offset relative to the RF voltage received by the bottom electrode 110.

While FIG. 1 illustrates a single power supply 116, the power supply 116 may include multiple separate power supplies. The supplemental electrode may be coupled to the power supply 116 by an electrical connector separate from the electrical connectors 117/118 that are coupled to the bottom electrode 108 and the top electrode 110.

The plasma etching system 100 may include a control system 122. The control system 122 controls the power supply 116. The control system 122 can control the voltage received by the supplemental electrode. The control system 122 can include data indicating the thickness of the focus ring 112. The control system 122 can cause the power supply 116 to supply a voltage to the supplement electrode selected to compensate for the current thickness of the focus ring 112 and create a uniform plasma sheath at the periphery of the wafer 106.

The control system 122 can include data indicating the age or the total usage time of the focus ring 112. Because the reduction in thickness of the focus ring 112 is proportional to the amount of time that the focus ring 112 has been used in a plasma etching process, the age or total usage time of the focus ring can be utilized to determine the magnitude of the supplemental electric field to be utilized. Accordingly, the control system 122 can control the power supply 116 to apply a voltage to the supplemental electrode based on the age or total usage time of the focus ring 112.

In one embodiment, the plasma etching system 100 can include a sensor that measures the thickness of the focus ring 112. The sensor can pass sensor signals to the control system 122 indicating the thickness of the focus ring 112. The control system 122 can then control the power supply 112 to apply voltages to the supplemental electrode based on the measured thickness of the focus ring 112.

In one embodiment, the supplemental device 114 can include a dielectric substrate placed beneath the focus ring 112. The dielectric substrate can affect an electric field at the periphery of the wafer 106 and that the focus ring 112 resulting from the voltage applied between the bottom electrode 108 and the top electrode 110. The dielectric substrate can include polymers, ceramics, oxides, nitrites, or other materials that can affect the electric field generated between the bottom electrode 108 and the top electrode 110 at the location of the focus ring 112 and the periphery of the wafer 106 in order to straighten the plasma sheath.

Figure 2:
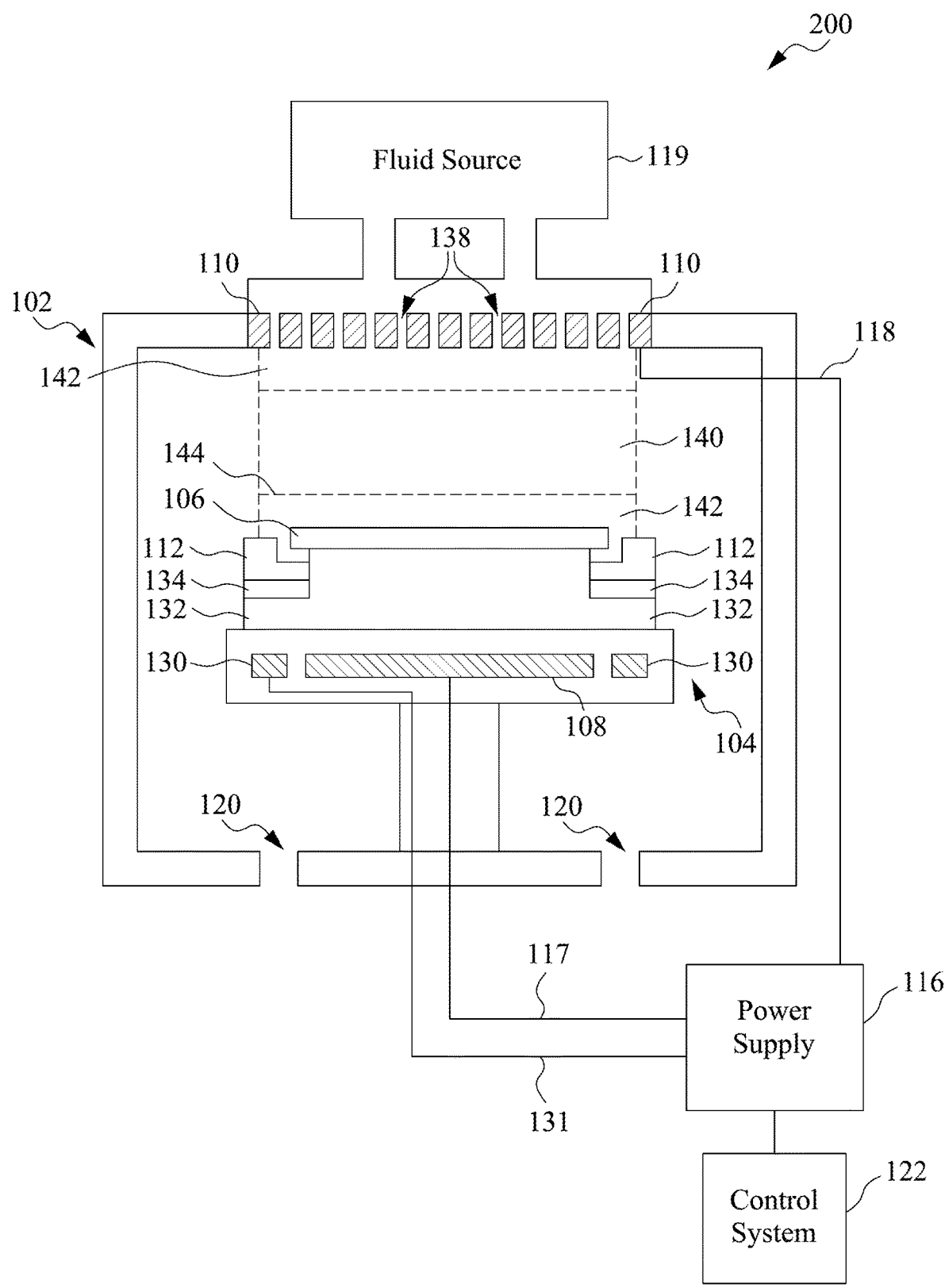
FIG. 2 is an illustration of a plasma etching system, according to one embodiment.

FIG. 2 is an illustration of a plasma etching system 200, according to one embodiment. The plasma etching system 200 is configured to perform a plasma etching process on a wafer 106. As is set forth in more detail below, the plasma etching system is configured to supply a supplemental electric field at the periphery of the wafer 106 in order to maintain a flat profile of a plasma sheath above the periphery of the wafer.

The plasma etching system includes a plasma etching chamber 102. A wafer support 104 is positioned within the plasma etching chamber 102. The wafer support 104 includes an electrostatic chuck 132. The electrostatic chuck supports the wafer 106. The electrostatic chuck may hold the wafer 106 at a steady position by electrostatic force between the wafer 106 and the electrostatic chuck 132. Accordingly, the electrostatic chuck 106 may receive a DC voltage from the power source 116. Though not shown in FIG. 2, the wafer support 104 may include a heater configured to heat the wafer 106.

A focus ring 112 is positioned surrounding the wafer 106. The focus ring 112 is positioned on the wafer support 104. In some embodiments, a polymer substrate 134 may be positioned between the focus ring 112 and the electrostatic chuck 132. In some embodiments, the focus ring 112 is not positioned on the electrostatic chuck, but rather on a separate structure of the wafer support 104.

The wafer support 104 includes a bottom electrode 108 positioned below the wafer 106. The wafer support 104 is connected to the power source 116 by electrical connector 118. The bottom electrode 108 may include a plate electrode, a coil electrode, or other types of electrodes.

The plasma etching system 200 includes a top electrode 110 and a fluid source 119. In the example of FIG. 2, the top electrode 110 is a showerhead type electrode including a plurality of channels 138 that enable fluid to flow from the fluid source 119 into the plasma etching chamber 102. The showerhead type electrode can correspond to a plate electrode perforated by a plurality of vent holes 138. The top electrode 110 is coupled to the power source 116 by an electrical connector 118.

During a plasma etching process, the power source 116 supplies a radiofrequency voltage between the bottom electrode 108 and the top electrode 110. In the example of FIG. 2, the top electrode 110 receives ground voltage. In this case, the bottom electrode 108 is the power electrode that receives the radiofrequency voltage relative to ground. However, in other embodiments, the top electrode 110 can be the power electrode that receives the radiofrequency voltage and the bottom electrode 108 can be the ground electrode that receives ground voltage.

During the plasma etching process, fluid flows from the fluid source 119 through the channels 138 into the plasma etching chamber 102. The radiofrequency voltage generates a plasma from the fluid by ionizing the fluid. The plasma forms between the wafer 106 and the top electrode 110. Typically, the plasma includes a plasma body 140 and a plasma sheath 142. The plasma body 140 is separated from the wafer 106 by the plasma sheath 142. The plasma sheath also forms between the body 140 and the top electrode 110. The plasma sheath 142 may also be called an electrostatic sheath. The plasma sheath 140 has a greater density of positive ions and, hence, carries an overall excess positive charge.

As described previously in relation to FIG. 1, during the plasma etching process, ions travel downward from the interface 144 between the sheath 142 and the body 140 toward the wafer 106. The ions react with and etch exposed portions of the wafer 106.

The trajectory of the ions traveling toward the wafer 106 depends, in part, on the shape of the sheath 142, or on the shape of the interface 144 between the sheath 142 and the plasma body 140. Where the interface 144 is substantially horizontal, the ions will travel substantially straight downward and etch the wafer 106 anisotropically in a downward vertical direction. If the interface 144 between the sheath 142 and the plasma body 140 is not substantially horizontal, then the ions will travel the diagonal direction and will not properly etch the wafer 106 in the pattern of the formed on the wafer 106. This can result in vias that do not contact the appropriate structure below the surface of the wafer 106.

As described in relation to FIG. 1, the focus ring 112 may slowly decrease in thickness over the course of many plasma etching processes. The decrease in thickness of the focus ring 112 results in non-horizontal interface 144 of the plasma sheath 142 at the periphery of the wafer 106.

The plasma etching system 200 includes a supplemental electrode 130 positioned within the wafer support 104 and adjacent to the bottom electrode 108. The supplemental electrode 130 is one example of the supplement device 114 of FIG. 1. The supplemental electrode 130 is positioned below the focus ring 112 and the periphery or edge of the wafer 106. The supplemental electrode 130 is connected to the power source 116 by an electrical connector 131. Shows a single power source 116, the power source 116 may correspond to multiple power sources or a single power source. The power source 116 supplies a supplemental voltage to the supplemental electrode 130. The supplemental voltage results in a supplemental electric field above the focus ring 112 and the periphery of the wafer 106. The supplemental electric field has the effect of straightening the interface 144 between the sheath 142 and the plasma body 140. Said another way, the supplemental electric field causes the sheath 142 they have a horizontal interface 144 above the focus ring 112 and the periphery of the wafer 142.

In an example in which the bottom electrode one is the power electrode that receives a radiofrequency voltage, the supplemental electrode 130 may also receive a radiofrequency voltage in phase with the radiofrequency voltage received by the bottom electrode one, but with a different amplitude. The amplitude of the supplemental voltage can be greater or smaller than the amplitude of the radiofrequency voltage received by the bottom electrode 108. Additionally, or alternatively, the supplemental voltage can have a DC component greater than or less than a DC component of the radiofrequency voltage.

In an example in which the bottom electrode 108 is the ground electrode and the top electrode 110 is the power electrode that receives the radiofrequency voltage, the bottom electrode 130 may receive a DC voltage higher or lower than ground in order to generate the supplemental electric field to maintain a horizontal interface between the plasma sheath 142 and the plasma body 140.

In one embodiment, the supplemental electrode 130 is adjacent to the top electrode 110 rather than adjacent to the bottom electrode 108. In this case, the supplemental electrode 130 is positioned above the focus ring 112 and the periphery of the wafer 106.

Figure 3A:
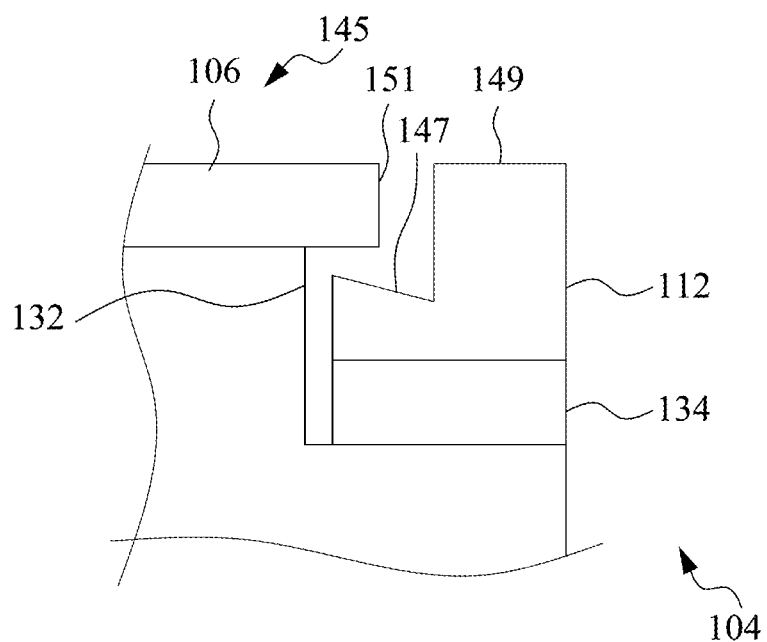
FIGS. 3A-3D are enlarged views of a focus ring and peripheral regions of a wafer, according to one embodiment.

FIG. 3A is an enlarged side-sectional view of a portion of the plasma etching system 200 of FIG. 2, according to one embodiment. In particular, the view of FIG. 3A illustrates the focus ring 112 and the peripheral region 145 of the wafer 106 supported on the wafer support 104. In particular, the wafer 106 supported on the electrostatic chuck 132. The focus ring 112 has a lower portion 147 below the wafer 106. The focus ring 112 has an upper portion 149 positioned laterally from the edge of the wafer 106. Accordingly, the peripheral region 145 extends partly over the lower portion 147 of the focus ring 112.

The view of FIG. 3A illustrates the focus ring 112 before the focus ring has taken part in any plasma etching processes. Accordingly, in FIG. 3A the focus ring 112 has not yet lost any thickness due to participation in plasma etching processes.

Figure 3B:
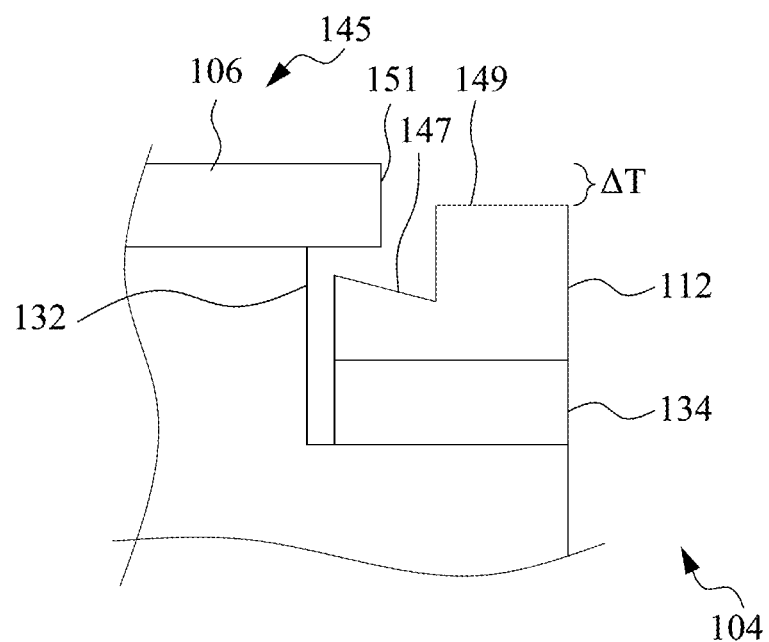

FIG. 3B is an enlarged side sectional view of a portion of the plasma etching system 200 of FIG. 2 after the focus ring 112 has participated in a large number of hours of plasma etching processes. In one example, the focus ring 112 has participated in 400 hours of plasma etching processes. This prolonged time in plasma etching processes has resulted in a change in thickness ΔT with respect to the focus ring 112 of FIG. 3A. In one example, ΔT is 0.2 mm, though other changes in thickness are possible.

In one embodiment, the total thickness of the combination of the polymer substrate 134 and the focus ring 112 is initially 1.03 mm. After 245 hours of plasma etching processes, the total thickness of the polymer substrate 134 and the focus ring 112 has decreased to 0.75 mm. After 336 hours of plasma etching processes, the total thickness of the polymer substrate 134 and the focus ring 112 has decreased to 0.72 mm. After 400 hours of plasma etching processes, the total thickness of the polymer substrate 134 and the focus ring 112 has decreased to 0.67 mm. Other thicknesses and changes in thickness are possible without departing from the scope of the present disclosure.

Figure 3C:
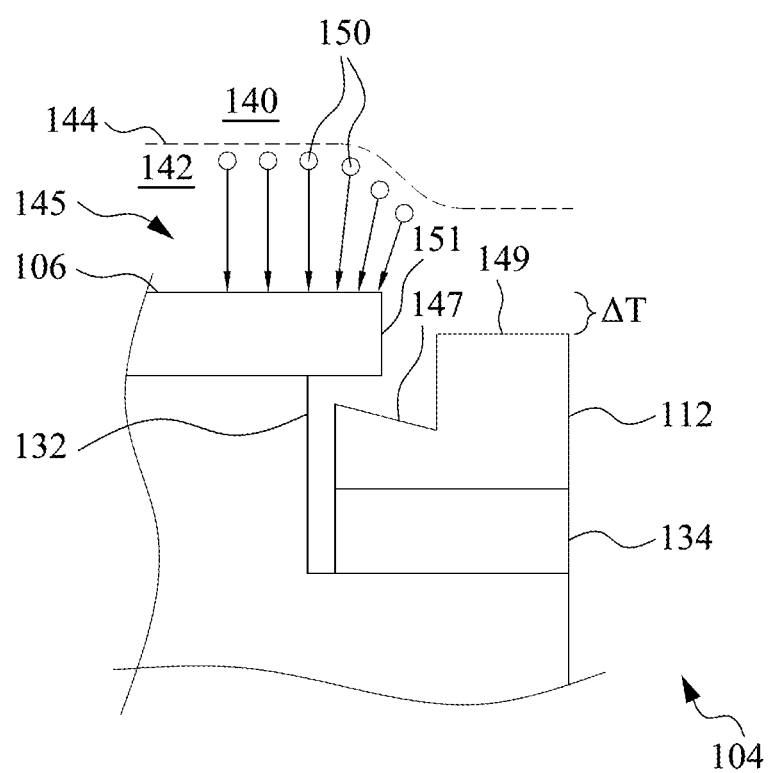

FIG. 3C corresponds to the view of FIG. 3B during a plasma etching process in which the previously described supplemental electric field is not applied. The plasma body 140 is generated above the wafer 106 and the focus ring 112. The plasma sheath 142 is positioned between the wafer 106 and the plasma body 140. Because of the change in thickness ΔT and because the supplemental electric field is not applied, the plasma sheath 142 curves downward above the peripheral region 145 of the wafer 106 and above the focus ring 112.

FIG. 3C also illustrates the ions 150 traveling from the interface 144 through the plasma sheath 142 toward the wafer 106. The ions etch the exposed portions of the wafer 106 in their direction of travel. As can be seen in FIG. 3C, the ions travel substantially straight downward where the interface 144 of the sheath 142 is substantially horizontal. The ions 150 travel in a diagonal direction in the regions where the interface 140 for the sheath 142 is curved. This diagonal direction of travel results in vias and trenches extending diagonally rather than straight downward. The result is vias and trenches that are not properly aligned with the features below them.

Figure 3D:
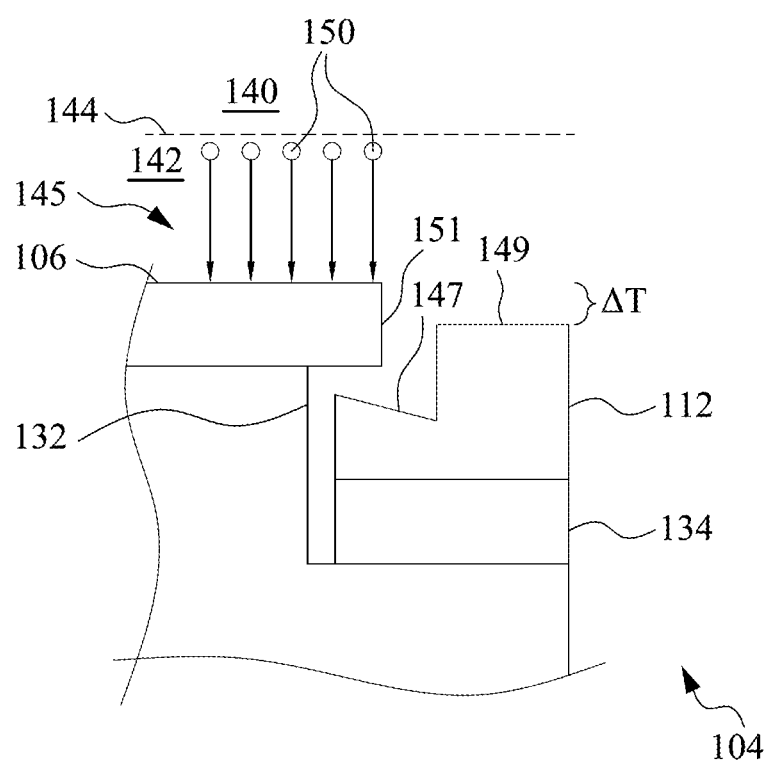

FIG. 3D corresponds to the view of FIG. 3B during a plasma etching process in which the supplemental electric field is applied, according to one embodiment. As can be seen in FIG. 3D, the interface 144 of the plasma sheath 142 is horizontal above the peripheral region 145 of the wafer 106 and above the focus ring 112, in spite of the loss of thickness in the focus ring 112. Because the plasma sheath 142, or the interface 144 of the plasma sheath 142 is horizontally straight above the peripheral region 145 of the wafer 106 and above the focus ring 112, the ions 150 travel with a downward trajectory rather than a diagonal trajectory. The result is that vias and trenches formed in the peripheral region of the wafer 106 are properly aligned with the features below them.

Figure 4A:
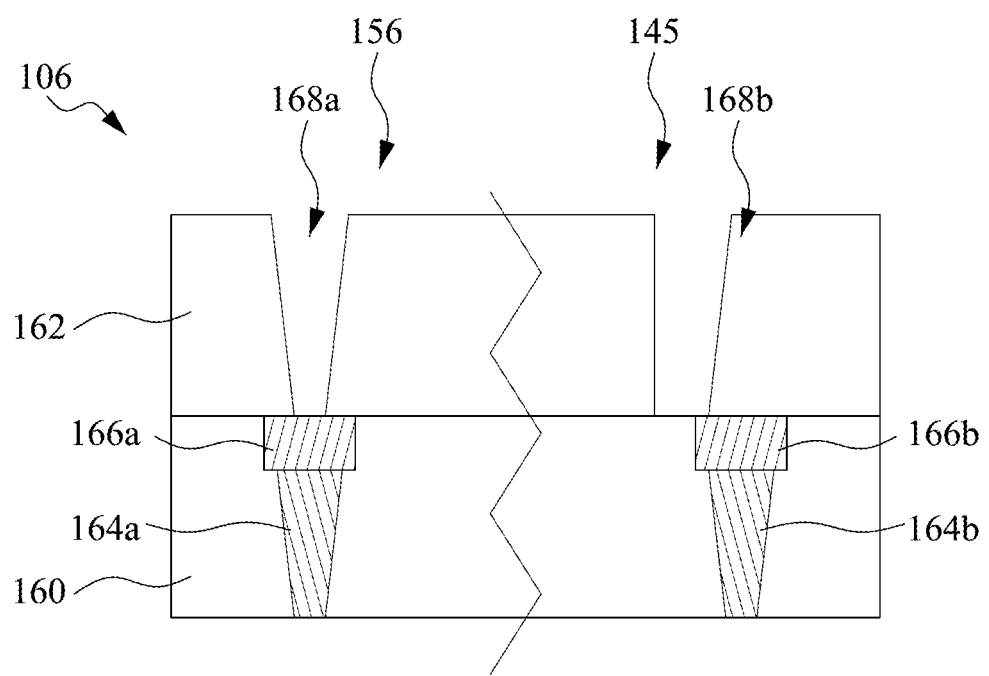
FIG. 4A is cross-sectional view of a wafer without application of a supplemental electric field.

FIG. 4A is a cross-sectional view of a wafer 106, according to one embodiment. The view of FIG. 4A illustrates a central region 156 of the wafer 106 and the peripheral region 145 of the wafer 106. FIG. 4A corresponds to a situation in which focus ring 112 is significantly decreased in thickness and a supplemental electric field is not supplied.

The integrated circuit 160 includes a first interlevel dielectric layer 160 and a second interlevel dielectric layer 162 on the first interlevel dielectric layer 160. A conductive via 164a is formed in the first interlevel dielectric layer 160 of the central region 156 of the wafer 106. A metal line 160a is in contact with the via 164a. A trench 168a has been formed in the second interlevel dielectric layer 162 of the central region 156. The trench 168a has been formed using a plasma etching process as described herein. Because the trench 168a is formed in the central region 156, the trench 168a is properly aligned with and contacts the metal line 166a.

A conductive via 164b is formed in the first interlevel dielectric layer 160 of the peripheral region 145 of the wafer 160. A metal line 160b is in contact with the via 164b. A trench 168b has been formed in the second interlevel dielectric layer 162 of the peripheral region 145. The trench 168b has been formed using a plasma etching process as described herein, but without the supplemental electric field. Because the trench 168b is formed in the peripheral region 145 without the aid of the supplemental electric field, the trench 168b is not properly aligned with the metal line 166b. The trench 168b is tilted with respect to vertical because the ions 150 have a non-vertical trajectory due to the bend in the plasma sheath 142 at the peripheral region 145 of the wafer 106.

Figure 4B:
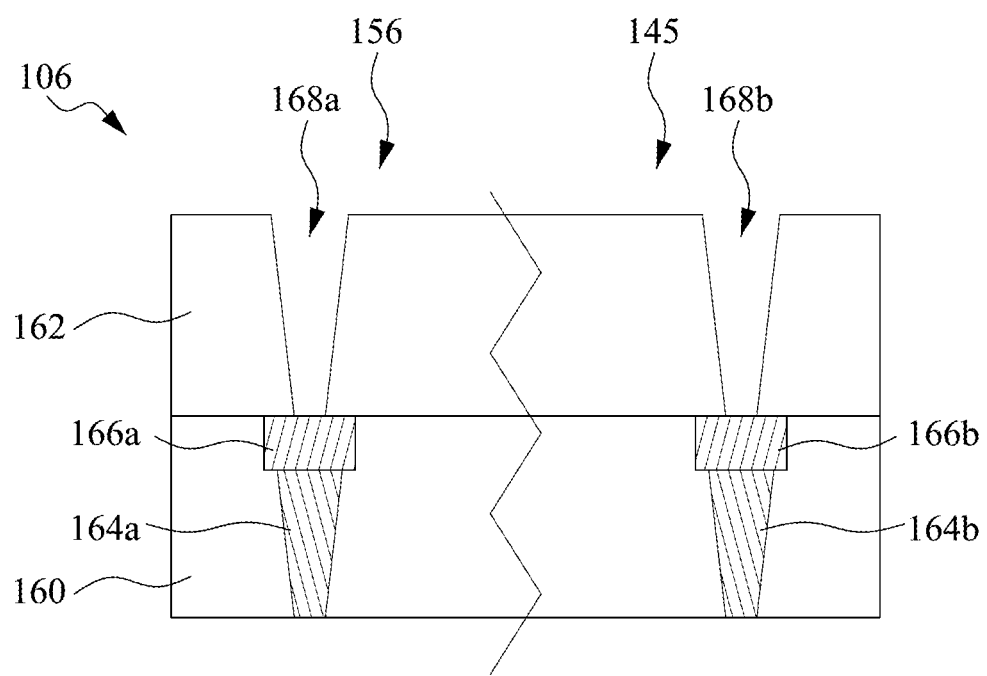
FIG. 4B is cross-sectional view of a wafer with application of a supplemental electric field, according to one embodiment.

FIG. 4B is a cross-sectional view of a wafer 106 according to one embodiment. The view of FIG. 4B includes the central region 156 and the peripheral region 145 of the wafer 106 as shown in FIG. 4A. However, the view of FIG. 4B corresponds to a situation in which the supplemental electric field has been generated by applying the supplemental voltage to the supplemental electrode 130 during the etching process in order to make the plasma sheath horizontal at the edge of the wafer 106. Accordingly, in FIG. 4B at the peripheral region 145 the trench 168b is properly aligned with the metal line 166b and properly contacts the metal line 166b. Furthermore, the trench 168 is not tilted with respect to vertical. Accordingly, the view of FIG. 4B illustrates one of the benefits of applying the supplemental electric field as described herein. Features at the periphery of a wafer 106 do not suffer from tilting and misalignment when the supplemental electric field is used. This results in better functioning integrated circuits and higher wafer yields.

In one embodiment, the dielectric layers 160 and 162 include a low-k silicon oxide film. The dielectric layers 160 and 162 have a thickness between 500 Å and 3000 Å. The trenches 168a and 168b can correspond to apertures four conducted via having a critical dimension between 150 Å and 800 Å. The metal lines 166a and 166b can have a critical dimension between 200 Å and 1200 Å. Other materials and sizes can be utilized without departing from the scope of the present disclosure.

Figure 5:
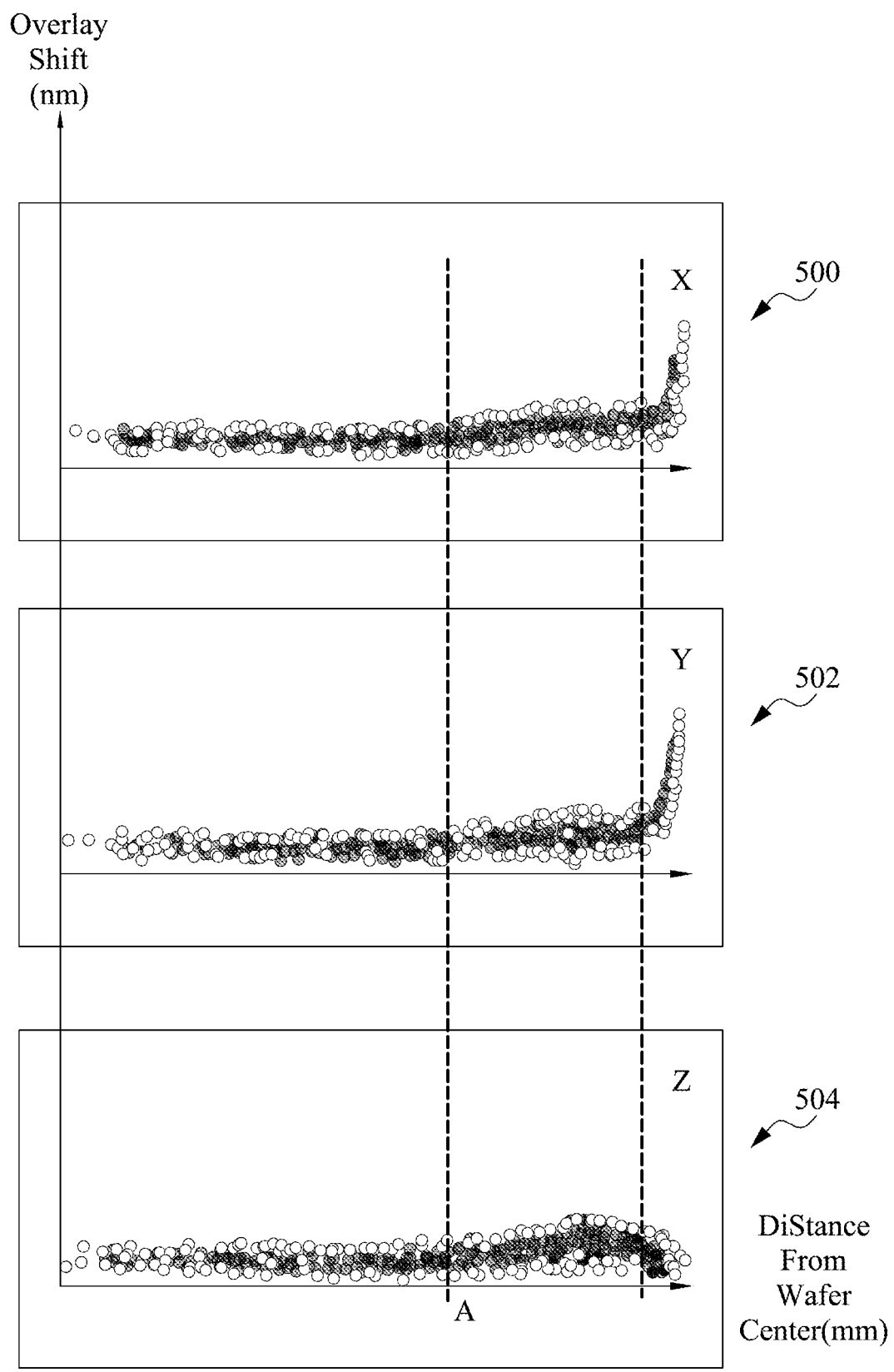
FIG. 5 illustrates a plurality of graphs of mask overlay shift in a wafer, according to one embodiment.

FIG. 5 includes a plurality of graphs indicating the overlay shift in wafers. The y-axis corresponds to the overlay shift in nanometers. The overlay shift corresponds to the misalignment of features formed. The x-axis corresponds to the distance from the wafer center in millimeters for a wafer with a radius of 150 mm.

The graph 500 corresponds to a situation in which the focus ring 112 has been used either very little or not at all and hence has not suffered a substantial decrease in thickness. The graph 500 also corresponds to a situation in which the supplemental electric field is not been applied. The overlay shift at the edge of the wafer is about X nm. This is a very substantial shift that can lead to serious alignment failures. Accordingly, without the supplemental electric field misalignment is high at the peripheral regions of the wafer 106 even for unused or lightly used focus rings 112.

The graph 502 corresponds to a situation in which the focus ring 112 has been used for about A hours. In the graph 502, the supplemental electric field has not been applied. Accordingly, at the peripheral regions of the wafer, the overlay shift is Y nm for the graph 502, Y being about 120% more than X.

The graph 504 corresponds to a situation in which the focus ring 112 has been used for about A hours. In the graph 504, the supplemental electric field has been applied. In this case, at the peripheral regions of the wafer the overlay shift is only about Z nm. Z being about 45% of X. Accordingly, application of the supplemental electric field significantly improves overlay and alignment at the peripheral regions 145 of a wafer 106. In one example, the supplemental electric field is generated by applying a supplemental voltage to the supplemental electrode 130. The supplemental voltage can have an RF frequency between 10 MHz and 20 MHz and a DC offset between 20 V and 60 V. In a particular example, the supplemental voltage has a DC offset of 40 V and a frequency of 13.56 MHz. Other frequencies and DC offsets can be utilized without departing form the scope of the present disclosure.

In one embodiment, the working range for the supplemental electrode 130 is up to 50% higher or lower than the power output of the bottom electrode 108. In one embodiment, the working range from supplemental electrode is 40%. Other power outputs can be utilized for the supplemental electrode 130 without departing from the scope of the present disclosure.

Figure 6:
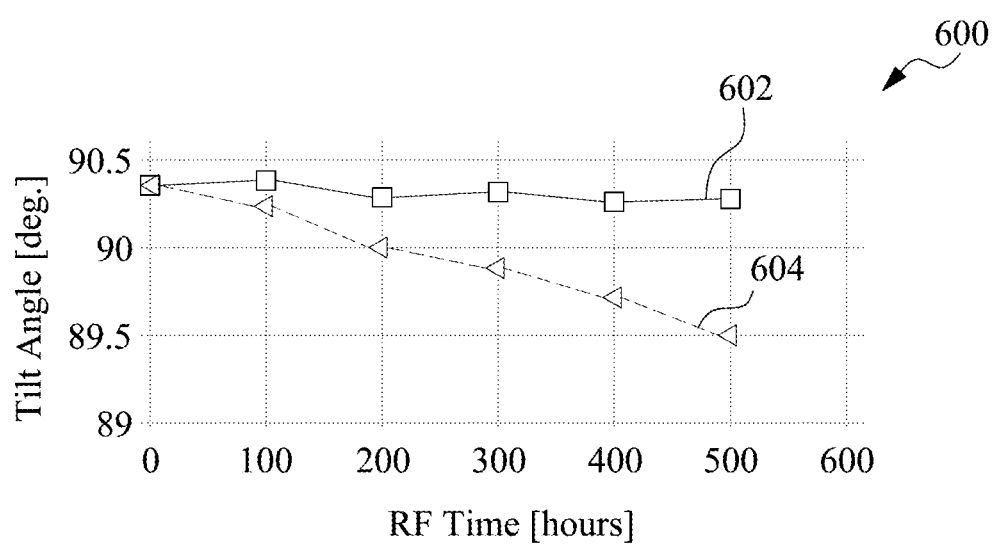
FIG. 6 is a graph of tilt angle for features formed in a wafer, according to one embodiment.

FIG. 6 illustrates a graph 602 of trench tilt at peripheral regions 145 of a wafer 106, according to one embodiment. The x-axis corresponds to the total time that a focus ring 112 has been used in plasma etching processes. The y-axis corresponds to the tilt angle of features formed at peripheral regions 145 of the wafer 106. The curve 602 corresponds to a wafer in which the supplemental electric field has been applied. As can be seen, for the curve 602 the tilt remain substantially constant.

In one embodiment, after the focus ring 112 has undergone 500 hours of plasma etching processes, the trench angle at the periphery of the wafer 106 is 90.2° when utilizing the supplemental voltage to straighten the plasma sheath. The trench angle may be 89.5° at 500 hours if the supplemental voltage is not utilized to straighten the plasma sheath.

In one example, after 500 hours the profile field may only change from 90.33° to 90.28° when utilizing the supplemental voltage to straighten the plasma sheath. The profile tilt may change from 90.33° to 89.51° after 500 hours if the supplemental voltage is not utilized to straighten the plasma sheath. With the supplemental voltage, the shift is only 0.05°. Without the supplemental voltage, the shift amount is 0.8°.

The curve 604 corresponds to a wafer in which the supplemental electric field has not been applied. As can be seen from the curve 604, the tilt changes nearly an entire degree from vertical at the hour mark. This can result in serious misalignment of features formed in plasma etching processes.

Figure 7:
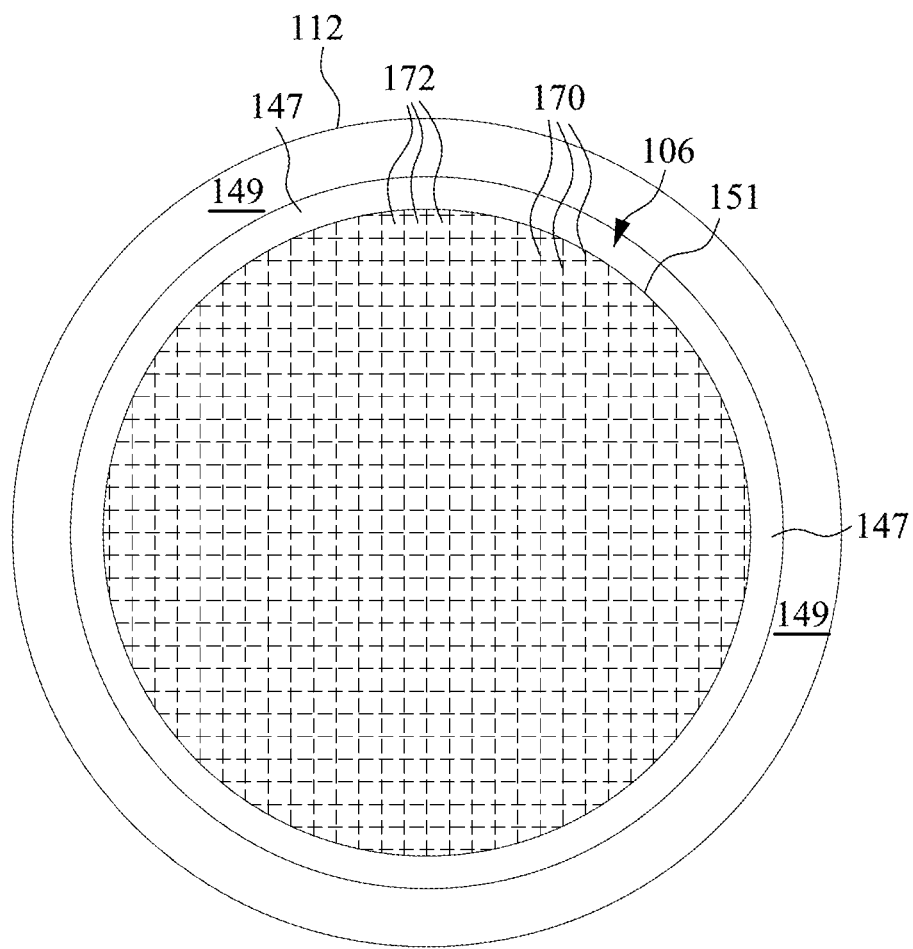
FIG. 7 is a top view of a wafer surrounded by a focus ring, according to one embodiment.

FIG. 7 is a top view of a wafer 106 surrounded by a focus ring 112, according to one embodiment. The wafer 106 includes a plurality of dicing lines 170. The dicing lines form a grid that define individual integrated circuits 172 that will be diced from the wafer 106 after processing of the wafer is complete. Integrated circuits 172 at the periphery of the wafer 106, or near the edge 151 benefit particularly from the supplemental electric field described herein. Because features formed in the integrated circuits 172 near the edge one of the wafer 106 will be strengthened properly aligned due to the application of the supplemental electric field.

FIG. 7 also illustrates the focus ring 112. The focus ring 112 includes an upper portion 149 laterally spaced apart from the wafer 106. The focus ring 112 also includes a lower portion 147 that extends below the edge 151 of the wafer 106.

In one embodiment, the wafer 106 has a diameter of 300 mm. The focus ring 112 can have an outer diameter between 320 mm 400 mm. The inner diameter of the upper portion 149 can be between 302 mm and 310 mm. Other dimensions for the wafer 106 and the focus ring 112 can be utilized without departing from the scope of the present disclosure.

Figure 8:
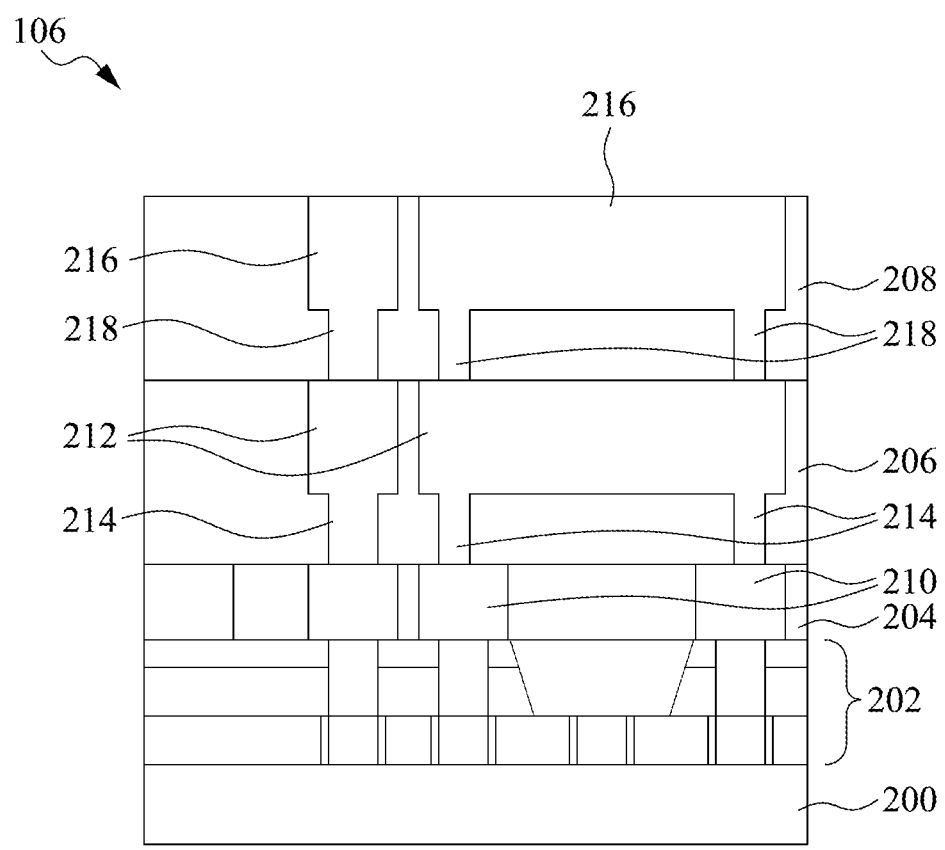
FIG. 8 is a cross-sectional view of a wafer, according to one embodiment.

FIG. 8 is a cross-section of a wafer 106, according to one embodiment. The wafer 106 includes a substrate 200. Middle end of line layers 202 are formed over the substrate 200. Transistors may be formed in conjunction with the substrate 200 and the middle end of line layers 202. The middle end of line layers 202 can include metal gates, source and drain electrodes, gate dielectrics, silicides, various dielectric layers, and other structures associated with formation of transistors. The middle end of line layers 202 may include metal contact structures that contact gate electrodes and source and drain electrodes.

The wafer 106 includes interlevel dielectric layers 204, 206, and 208. The interlevel dielectric layer 204 is formed above the middle end of line layers 202. The interlevel dielectric layers 204, 206, and 208 can include one or more of silicon oxide, silicon nitride, porous silicon oxide, tetraethyl orthosilicate (TEOS), silicon carbide, or other suitable dielectric layers and materials.

Metal structures 210 are formed in the interlevel dielectric layer 204. These metal structures 210 contact metal structures or other conductive structures in the middle end of line layers 202. The metal structures 210 may be termed metal 0 structures. The metal structures 210 can include copper, tungsten, titanium, aluminum, or other suitable metals.

Metal lines 212 are formed in the interlevel dielectric layer 206. Metal vias 214 are also formed in the interlevel dielectric layer 206. The metal vias 214 electrically connect the metal lines 212 with the metal structures 210. The metal lines 212 and the metal vias 214 may be termed metal 1 structures. The metal lines 212 and the metal vias 214 can include copper, tungsten, titanium, aluminum, or other suitable metals.

Metal lines 216 are formed in the interlevel dielectric layer 208. The metal vias 218 are also formed in the interlevel dielectric layer 206. The metal vias 218 electrically connect the metal lines 216 with the metal lines 212. The metal lines 216 and the metal vias 218 may be termed metal 2 structures. The metal lines 216 and the metal vias 218 can include copper, tungsten, titanium, aluminum, or other suitable metals.

A plasma etching process may be utilized, as described above, to etch the apertures or trenches for the metal vias 212 and 216, the metal vias 214 and 218, and the metal structures 210. The apertures in the trenches may have very small contact windows. If the trenches and apertures are not etched in a straight downward direction, but instead have some tilting, then it is possible that the metal vias 214 and 218 will not contact the various metal lines in metal structures. The systems, components, and processes described above for ensuring that the plasma sheath straight near the edge of the wafer 106 can be utilized in the plasma etching processes for forming the trenches and apertures. This ensures that the trenches and apertures will be straight and that the corresponding metal vias will properly contact the metal structures 210 and the metal interconnects 212 and 216.

Figure 9A:
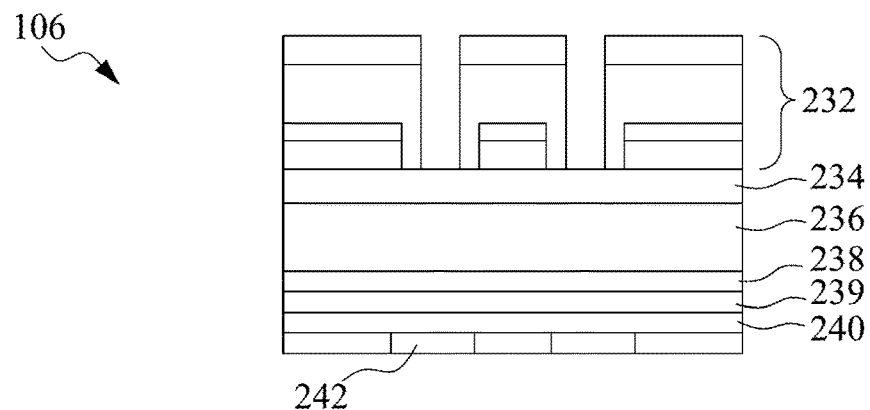
FIGS. 9A-9C are cross-sectional views of a wafer before and during a plasma etching process, according to one embodiment.
Figure 9B:
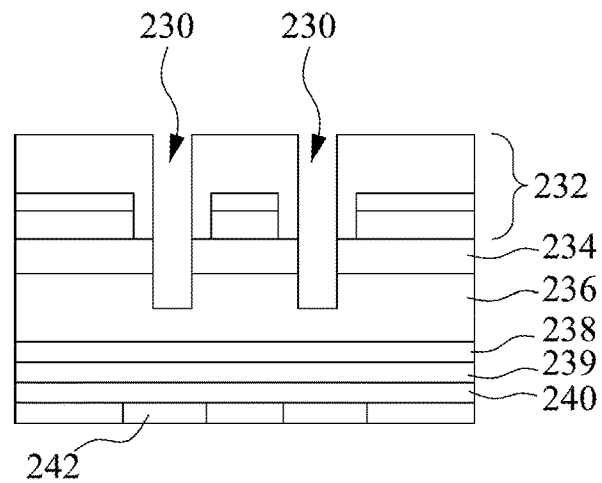
Figure 9C:
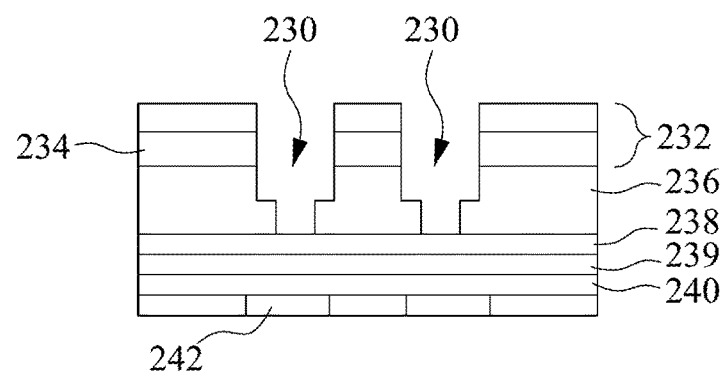

FIGS. 9A-9C are cross-sectional views of a wafer 106, according to some embodiments. In particular, FIGS. 9A-9C illustrate a plasma etching process in accordance with principles described above. The wafer 106 includes mask layers 232 having openings in accordance with the pattern of a photolithography mask. The wafer 106 includes dielectric layers 234, 236, 238, 239, and 240 below the mask layers 232. The wafer 106 includes metal structures 242 below the dielectric layers 234, 236, 238, 239, and 240. The dielectric layers 234, 236, and 238 may collectively represent an interlevel dielectric layer above the metal structures 242. The metal structures 242 may be metal 0 structures.

In one example, the mask layers 232 may include one or more of a patterned photoresist, a patterned low thermal oxide, patterned silicon nitride, patterned silicon carbide, or other materials. The dielectric layers 234, 236, 238, 239, and 240 may include one or more of TEOS, methyl silsesquioxane, silicon carbide, silicon nitride, organic dielectric layers, etch stop layers, or other suitable layers.

In FIG. 9A, the plasma etching process has not yet been performed. There are openings in the mask layers 232 exposing the dielectric layer 234. In FIG. 9B, the plasma etching process has begun. The plasma etching process forms apertures 230 below the openings in the mask layers 232. The plasma etching process has etched through the dielectric layer 234 and partially through the dielectric layer 236. In FIG. 9C, the plasma etching process has continued to etch through the dielectric layer 236 and has partially etched the dielectric layer 238. In practice, the plasma etching process may etch entirely through the dielectric layer 238. Subsequently, other etching processes can be performed to expose the metal structures 242. The plasma etching process etches straight downward because the plasma etching process compensates for the decrease in thickness of the focus ring 12 as described previously in relation to FIGS. 1-8.

Figure 10:
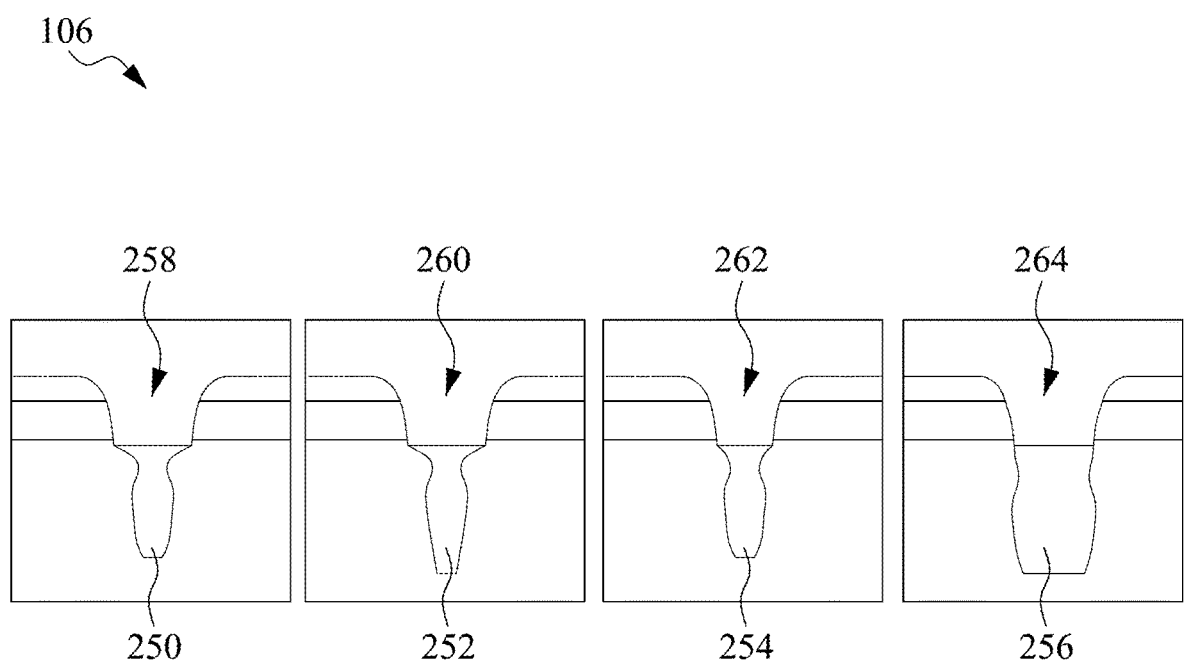
FIG. 10 illustrates trenches and vias formed in a wafer, according to one embodiment.

FIG. 10 includes cross-sectional views of a wafer 106, according to one embodiment. FIG. 10 illustrates four types of vias that can be formed in accordance with principles of the present disclosure, though vias have other shapes can be formed without departing from the scope of the present disclosure. In one example, the pitch associated with the vias is 30 nm, though other pitches sizes can be utilized without departing from the scope of the present disclosure. FIG. 10 illustrates four vias 250, 252, 254, and 256 and trenches 258, 260, 262, and 264 formed above the vias 250, 252, 254, and 256. The vias 250, 252, 254, and 256 and trenches 258, 260, 262, and 264 have different widths and shapes, but by utilizing principles of the present disclosure including compensating for a decrease in height of the focus ring 110, the vias 250, 252, 254, and 256 and trenches 258, 260, 262, and 264 can be formed in a manner that ensures proper alignment.

Figure 11:
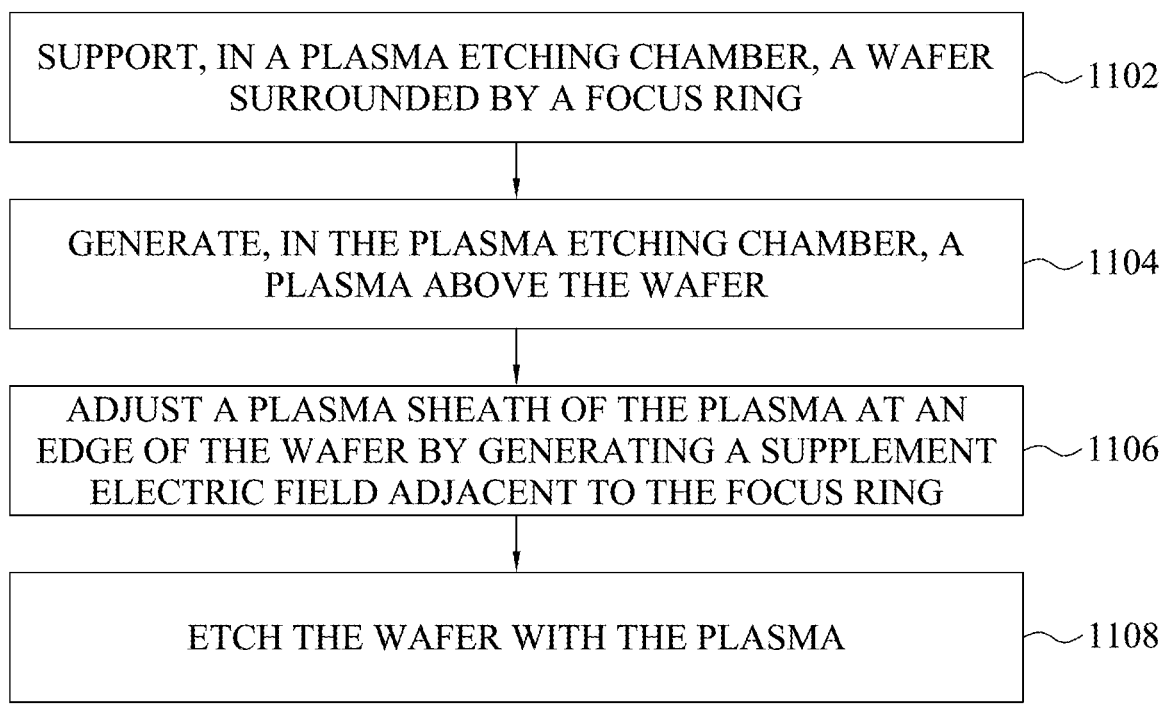
FIG. 11 is flow diagram of a plasma etching method, according to one embodiment.

FIG. 11 is a flow diagram of a method 1100 for performing a plasma etching process, according to one embodiment. The method 1100 can utilize the systems, components, and processes described in relation to FIGS. 1-7. At 1102, the method includes supporting, in a plasma etching chamber, a wafer surrounded by a focus ring. One example of a plasma etching chamber is the plasma etching chamber 102 of FIG. 1. One example of a wafer is the wafer 106 of FIG. 1. One example of a focus ring is the focus ring 112 of FIG. 1. At 1104, the method 1100 includes generating, in the plasma etching chamber, a plasma above the wafer. At 1106, the method 1100 includes adjusting a plasma sheath of the plasma at an edge of the wafer by generating a supplementary electric field adjacent to the focus ring. One example of a plasma sheath is the plasma sheath 142 of FIG. 2. At 1108, the method includes etching the wafer with the plasma.

Figure 12:
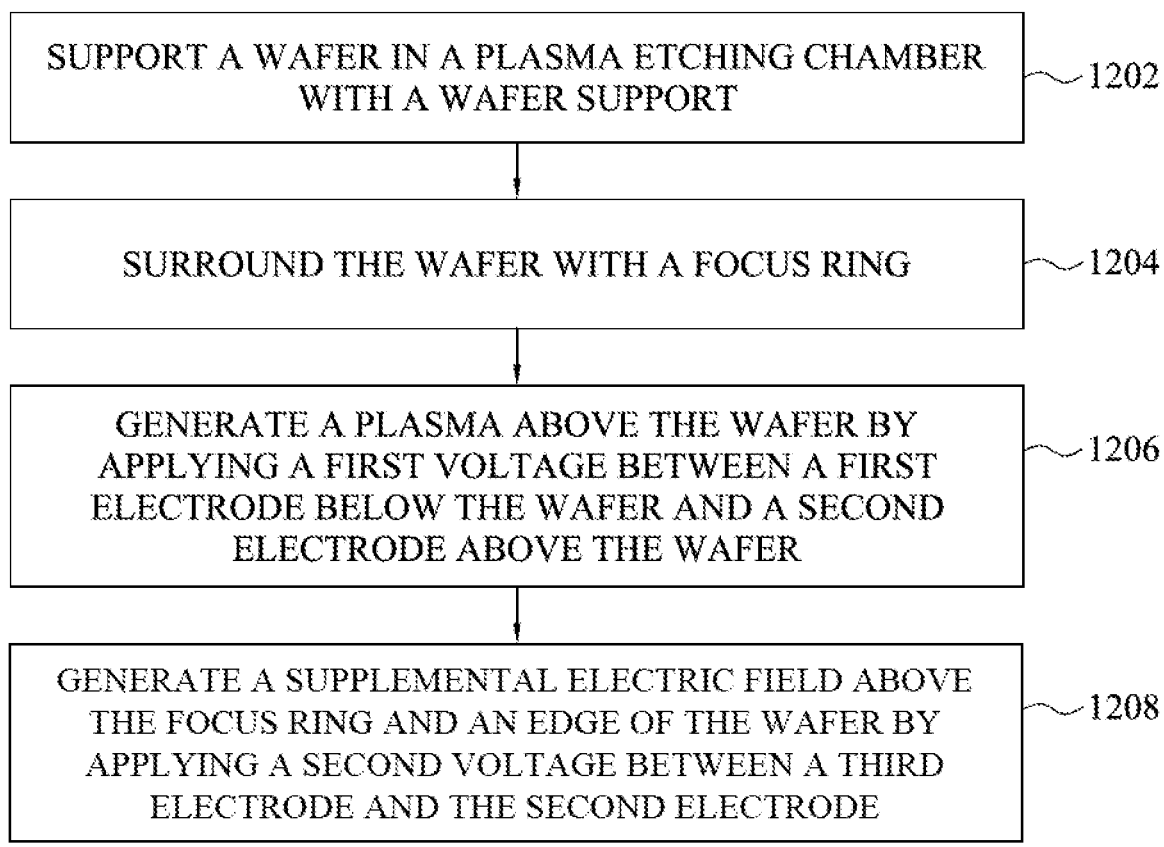
FIG. 12 is flow diagram of a plasma etching method, according to one embodiment.

FIG. 12 is a flow diagram of a method 1200 for performing a plasma etching process, according to one embodiment. The method 1200 can utilize the systems, components, and processes described in relation to FIGS. 1-8. At 1202, the method 1200 includes supporting a wafer in a plasma etching chamber with a wafer support. One example of a plasma etching chamber is the plasma etching chamber 102 of FIG. 2. One example of a wafer is the wafer 106 of FIG. 2. One example of a wafer support is the wafer support 104 of FIG. 2. At 1204, the method 1200 includes surrounding the wafer with a focus ring. One example of a focus ring is the focus ring 112 of FIG. 2. At 1206, the method 1200 includes generating a plasma above the wafer by applying a first voltage between a first electrode below the wafer and a second electrode above the wafer. One example of a first electrode is the bottom electrode 108 of FIG. 2. One example of a second electrode is the second electrode 110 of FIG. 2. At 1208, the method 1200 includes generating a supplemental electric field above the focus ring and an edge of the wafer by applying a second voltage between a third electrode and the second electrode. One example of a third electrode is the supplemental electrode 130 of FIG. 2.

In on embodiment, a method includes supporting, in a plasma etching chamber, a wafer surrounded by a focus ring, generating, in the plasma etching chamber, a plasma above the wafer, adjusting a plasma sheath of the plasma at an edge of the wafer by generating a supplementary electric field adjacent to the focus ring, and etching the wafer with the plasma.

In one embodiment, a system includes a plasma etching chamber, a wafer support configured to support a wafer and including a first electrode. The system includes a focus ring positioned on the wafer support and configured to surround the wafer when the wafer is positioned on the wafer support. The system includes a second electrode and a power supply configured to generate a plasma in the plasma etching chamber by applying a voltage between the first electrode and the second electrode. The system includes a supplement device configured to provide a supplemental electric field adjacent to the focus ring when the power supply generates the plasma.

In one embodiment, a method includes supporting a wafer in a plasma etching chamber with a wafer support, surrounding the wafer with a focus ring, and generating a plasma above the wafer by applying a first voltage between a first electrode below the wafer and a second electrode above the wafer. The method includes generating a supplemental electric above the focus ring and an edge of the wafer by applying a second voltage between a third electrode and the second electrode.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
supporting, in a plasma etching chamber, a wafer surrounded by a focus ring;
generating, in the plasma etching chamber, a plasma above the wafer by applying a first radio frequency voltage between a first electrode below the wafer and a second electrode above the wafer;
generating, with a sensor, sensor signals indicative of a thickness of the focus ring;
receiving the sensor signals with a control system;
adjusting a plasma sheath of the plasma at an edge of the wafer by controlling, with the control system, generation of a supplementary electric field adjacent to the focus ring based on the sensor signals by applying a second radio frequency voltage between the second electrode and a third electrode below the focus ring, the second radio frequency voltage being in-phase with the first radio frequency voltage and having a different amplitude than the first radio frequency voltage; and
etching the wafer with the plasma.

2. The method of claim 1, further comprising:
generating the plasma by applying a radiofrequency voltage between a first electrode below the wafer and a second electrode above the wafer; and
generating the supplementary electric field by applying a supplementary voltage to a third electrode.

3. The method of claim 2, wherein the third electrode is below the wafer support adjacent to the first electrode.

4. The method of claim 1 further comprising
generating the supplementary electric field by applying the second radiofrequency voltage across a dielectric material below the focus ring.

5. The method of claim 1, further comprising selecting a strength of the supplementary electric field at the edge of the wafer based on a thickness of the focus ring.

6. The method of claim 1, further comprising selecting a strength of the electric field at the edge of the wafer based on an amount of time that the focus ring has been used in a plasma etching process.

7. The method of claim 1, further comprising straightening the plasma sheath above the edge of the wafer by applying the supplemental electric field.

8. The method of claim 1, wherein adjusting the plasma sheath includes changing the plasma sheath from non-horizontal to horizontal above the edge of the wafer.

9. A method, comprising:
supporting a wafer in a plasma etching chamber with a wafer support;
surrounding the wafer with a focus ring;
generating a plasma above the wafer by applying a first radio frequency voltage between a first electrode below the wafer and a second electrode above the wafer; and
generating a supplemental electric field above the focus ring and an edge of the wafer by applying a second radio frequency voltage between a third electrode above the focus ring and the first electrode, the second radio frequency voltage being in-phase with the first radio frequency voltage and having a different amplitude than the first radio frequency voltage.

10. The method of claim 1, further comprising straightening a plasma sheath above the edge of the wafer by generating the supplemental electric field.

11. The method of claim 9, wherein the second radio frequency voltage has a DC offset relative to the first radio frequency voltage.

12. The method of claim 9, comprising:
storing, within a control system, usage data indicating a total usage time of the focus ring; and
controlling, with the control system, a magnitude of the second voltage based on the usage data.

13. The method of claim 9, comprising:
generating, with a sensor, sensor signals indicative of a thickness of the focus ring;
receiving the sensor signals with a control system;
controlling, with the control system, generation of based on the sensor signals.

14. A method, comprising:
supporting a wafer on a wafer support in a plasma etching chamber and including a first electrode;
positioning a focus ring on the wafer support and including a first portion laterally surrounding the wafer and a second portion positioned below an edge of the wafer;
generating a plasma in the plasma etching chamber by applying a first radio frequency voltage between the first electrode and a second electrode above the wafer, wherein a top surface of a third electrode is coplanar with a top surface of the first electrode, and wherein a bottom surface of the first electrode is coplanar with a bottom surface of the third electrode; and straightening a plasma sheath above the edge of the wafer by applying a second radio frequency voltage between the second electrode and the third electrode positioned below the focus ring, the second radio frequency voltage being in-phase with the first radio frequency voltage and having a different amplitude than the first radio frequency voltage.

15. The method of claim 14, wherein the second radio frequency voltage has a DC offset relative to the first radio frequency voltage.

16. The method of claim 14, wherein the wafer support includes an electrostatic chuck.

17. The method of claim 16, wherein a polymer substrate is positioned between the third electrode and the focus ring.

18. The method of claim 14, wherein the third electrode is configured to change the plasma sheath from non-horizontal to horizontal above an edge of the wafer.

19. The method of claim 18, further comprising controlling, with a control system, a power supply to apply the first radio frequency voltage and the second radio frequency voltage.

20. The method of claim 19, wherein the control system is configured to control the third electrode to generate a supplemental electric field with the second radio frequency voltage.

* * * * *